(12) United States Patent
Farid et al.

(10) Patent No.: US 8,109,324 B2
(45) Date of Patent: Feb. 7, 2012

(54) MICROCHANNEL HEAT EXCHANGER WITH MICRO-ENCAPSULATED PHASE CHANGE MATERIAL FOR HIGH FLUX COOLING

(75) Inventors: Mohammed Mehdi Farid, Auckland (NZ); Said Al-Hallaj, Chicago, IL (US)

(73) Assignee: Illinois Institute of Technology, Chicago, IL (US)

( * ) Notice: Subject to any disclaimer, the term of this patent is extended or adjusted under 35 U.S.C. 154(b) by 1795 days.

(21) Appl. No.: 11/105,716

(22) Filed: Apr. 14, 2005

(65) Prior Publication Data

US 2006/0231233 A1 Oct. 19, 2006

(51) Int. Cl.
*F28F 7/00* (2006.01)
*H05K 7/20* (2006.01)
*F28D 15/00* (2006.01)

(52) U.S. Cl. .......... 165/80.4; 165/104.33; 361/699; 361/700

(58) Field of Classification Search .......... 165/10, 165/104.33, 80.4; 369/699; 361/700, 699
See application file for complete search history.

(56) References Cited

U.S. PATENT DOCUMENTS

| | | | |
|---|---|---|---|
| 4,446,698 A | 5/1984 | Benson | |
| 4,807,696 A * | 2/1989 | Colvin et al. | 165/10 |
| 4,911,232 A * | 3/1990 | Colvin et al. | 165/104.17 |
| 5,007,478 A | 4/1991 | Sengupta | |
| 5,083,605 A * | 1/1992 | Collings | 165/10 |
| 5,203,401 A * | 4/1993 | Hamburgen et al. | 165/80.4 |
| 5,224,356 A | 7/1993 | Colvin et al. | |
| 5,238,056 A | 8/1993 | Scotti et al. | |
| 5,309,319 A * | 5/1994 | Messina | 361/699 |
| 5,380,956 A * | 1/1995 | Loo et al. | 174/252 |
| 5,727,618 A * | 3/1998 | Mundinger et al. | 165/80.4 |
| 5,804,297 A | 9/1998 | Colvin et al. | |
| 6,099,894 A | 8/2000 | Holman | |
| 6,202,739 B1 * | 3/2001 | Pal et al. | 165/104.33 |
| 6,224,784 B1 | 5/2001 | Hayes | |
| 6,397,618 B1 | 6/2002 | Chu et al. | |
| 6,591,625 B1 | 7/2003 | Simon | |
| 6,679,315 B2 | 1/2004 | Cosley et al. | |
| 6,701,724 B2 | 3/2004 | Smith et al. | |
| 6,935,411 B2 * | 8/2005 | Valenzuela | 165/80.4 |
| 6,969,506 B2 * | 11/2005 | Tonkovich et al. | 423/652 |
| 7,218,519 B2 * | 5/2007 | Prasher et al. | 361/700 |
| 2002/0033247 A1 * | 3/2002 | Neuschutz et al. | 165/10 |
| 2002/0144811 A1 | 10/2002 | Chou et al. | |

(Continued)

FOREIGN PATENT DOCUMENTS

JP 02130948 A 5/1990
JP 2002057262 A 2/2002

OTHER PUBLICATIONS

Harpole, G.M. and James E. Engineer, Micro-channel heat exchanger, Dec. 14, 1991, IEEE Xplore, 1991 Semi-Therm VII, pp. 1-2.*

(Continued)

*Primary Examiner* — Cheryl J Tyler
*Assistant Examiner* — Brandon M Rosati
(74) *Attorney, Agent, or Firm* — Pauley Petersen & Erickson

(57) ABSTRACT

A microchannel cooler containing a slurry having a particulate liquid/solid phase change material is provided balancing the interdependent factors of microencapsulated particle size with microchannel size and shape and flow conditions for the removal of high heat flux with low space and low power requirements.

17 Claims, 1 Drawing Sheet

U.S. PATENT DOCUMENTS

| | | | |
|---|---|---|---|
| 2003/0043544 A1* | 3/2003 | Nelson et al. | 361/690 |
| 2003/0062149 A1 | 4/2003 | Goodson et al. | |
| 2003/0083410 A1* | 5/2003 | Baur et al. | 524/190 |
| 2003/0143958 A1 | 7/2003 | Elias et al. | |
| 2003/0164231 A1* | 9/2003 | Goodson et al. | 165/104.11 |
| 2004/0159422 A1 | 8/2004 | Zuo et al. | |
| 2004/0163797 A1 | 8/2004 | Cosley et al. | |
| 2004/0219732 A1 | 11/2004 | Burns et al. | |
| 2005/0205241 A1* | 9/2005 | Goodson et al. | 165/80.4 |
| 2005/0211418 A1* | 9/2005 | Kenny et al. | 165/80.4 |
| 2005/0244304 A1* | 11/2005 | Tonkovich et al. | 422/100 |
| 2006/0254762 A1* | 11/2006 | Tao et al. | 165/177 |
| 2007/0034356 A1* | 2/2007 | Kenny et al. | 165/80.4 |

OTHER PUBLICATIONS

Yamagishi, Characteristics of Microencapsulated PCM Slurry as a Heat Transfer Fluid, Apr. 1999, AIChe Journal, vol. 45, p. 696-707.*

Yamagishi, Y. et al., Characteristics of Microencapsulated PCM Slurry as a Heat-Transfer Fluid, AICHE Journal vol. 45, No. 4 (1999), pp. 696-707.

Xing, K.Q., et al., Performance Evaluation of Liquid Flow With PCM Particles in Mrcro-Channels, Journal of Heat Transfer, vol. 127 (2005), pp. 931-940.

Hu, X. et al., Novel insight and numerical analysis of convective heat transfer enhancement with microencapsulated phase change material slurries: laminar flow in a circular tube with constant heat flux, Int. Journal of Heat and Mass Transfer, vol. 45 (2002), pp. 3163-3172.

Choi, E. et al., Forced convection heat transfer with phase-change-material slurries: turbulent flow in a circular tube, Int. Journal of Heat and Mass Transfer, vol. 37, No. 2 (1994) pp. 207-215.

Charunyakorn, P. et al., Forced convection heat transfer in microencapsulated phase change material slurries: flow in circular ducts, Int. Journal of Heat and Mass Transfer, vol. 34, No. 3 (1991) pp. 819-833.

* cited by examiner

MICROCHANNEL HEAT EXCHANGER WITH MICRO-ENCAPSULATED PHASE CHANGE MATERIAL FOR HIGH FLUX COOLING

FIELD OF THE INVENTION

This invention relates generally to the removal of heat from volume or power constrained environments and, more particularly, to microchannel coolers suitable for the removal of high heat flux with low space and low power requirements.

BACKGROUND OF THE INVENTION

Technology advances in microchips, batteries, and various other small scale and high power applications are increasingly constrained by the need for effective thermal management. For example, increasing the speed of microprocessors may depend on effective new thermal management techniques to dissipate high heat fluxes. Similarly, electronic actuators that may take the place of hydraulics and mechanical actuators in aircraft may require similarly effective thermal management schemes. It is desirable that these thermal management, i.e., thermal transfer, schemes meet the criteria of low power consumption, low physical volume, and low weight owing to the small scale of many intended applications. Further, it is desirable that the heat transfer system should have few moving parts, require very little maintenance, and perform reliably in variable environmental conditions.

Phase change materials (PCM), i.e., materials that undergo a reversible latent energy transition upon transfer of thermal energy thereto, and particularly discrete particles of micro-encapsulated phase change material (MEPCM), have been proposed as a heat transfer material for microelectronics in stationary heat sink and heat pipe type heat transfer systems; such as in U.S. Pat. No. 5,007,478 and US Patent Application no. 2004/0159422, respectively. In these stationary heat sink and heat pipe type heat transfer systems flow conditions of the phase change material do not exist or are easily ignored.

In macro-scale heat transfer applications, MEPCM slurry, i.e., a two component fluid of liquid and suspended solids, has been suggested for use, such as in Colvin et al., U.S. Pat. No. 4,911,232. In these macro-scale systems, flow conditions of the slurry are basically laminar. Due to the large scale of such applications, there is no apparent concern for weight, volume or power consumption constraints.

In some microelectronic heat transfer systems, microchannel heat exchangers incorporating finned-microchannels have been suggested to achieve high cooling coefficients through high convective heat transfer coefficients and extended cooling surface area, such as in Goodson et al., US Patent Application no. 2003/0062149. However, due to flow condition considerations for the thermal transfer media, i.e., coolant fluid, within the microchannels, only liquid-component phase change materials of the boiling type have been suggested for use with microchannels.

SUMMARY OF THE PRESENT INVENTION

To Applicants' knowledge, no teaching exists within the art to use MEPCM in a microchannel heat exchanger because physical constraints such as flow conditions, including but not limited to laminar flow versus turbulent flow, viscosity problems, particle clogging, and the like; in a micro-channel environment have not suggested a practical use for a MEPCM slurry to achieve a balancing of the related and interdependent factors of PCM particle size and heat capacity with that of channel size and flow conditions necessary to achieve a small volume, low power microchannel heat transfer apparatus to obtain suitable heat transfer.

In one embodiment, the present invention provides a practical system for greatly enhancing the cooling efficiency of a microchannel heat exchanger by utilizing MEPCM suspended in the heat transfer liquid passing through the microchannels. The thermal storage advantage of solid PCM is coupled with the high heat flux capabilities of microchannels to achieve high heat flux with little temperature variation in the coolant medium. Advantages of the present invention include the capabilities for a low slurry flow rate and a low pressure drop across the microchannel heat exchanger leading to low pumping or compression power requirements for the thermal transfer apparatus.

According to the present invention, heat generated, e.g., by an electronic component such as an integrated circuit (IC) or the like, is removed at a high rate through a microchannel heat exchanger. The heat exchanger can comprise several closely-spaced high-aspect ratio channels, desirably in height to width, and having minimal wall thickness or channel gaps. A slurry comprising a heat transfer liquid and the MEPCM particles is pumped through the microchannels, absorbing the heat. The PCM is encapsulated in a material, typically a polymer, that permits the PCM to remain encapsulated in the liquid phase. Desirably, the PCM of the MEPCM particles enters the microchannel heat exchanger in the solid phase and exits in the liquid phase.

A secondary heat exchanger with a much larger available heat transfer area can be used to dissipate heat from the slurry to the environment away from the heat generating component and the heat exchanger. The MEPCM particles return to the solid phase after leaving the microchannels to be cycled again through the microchannel heat exchanger.

Accordingly, the present invention may provide a heat generating component, e.g., an IC, joined in heat transferring proximity to a microchannel heat exchanger comprising a series of microchannels passing a slurry having a two component fluid of liquid and suspended solids, and desirably containing a liquid/solid phase change material operable to melt in the heat range required for cooling the heat generating component. Desirably, the operating temperature of the coolant fluid will be centered on the melting point of the MEPCM. A pump for moving the liquid slurry through the heat exchanger can then be run with less power due to a lower flow rate required of the coolant than was heretofore available.

In some embodiments the present invention may provide the heat exchanger with an inlet and an outlet, and operate the heat exchanger to produce a small temperature difference of the slurry between the inlet and the outlet, such as about 5° C. or less to about 20° C. Accordingly, the pressure drop over the heat exchanger will be small and a substantially constant flow rate can be maintained whereby the pumping power requirements will be smaller than for a typical water or ethylene glycol/water mixture alone to achieve an equal or better cooling.

According to some embodiments of the invention, the microchannels have a high aspect ratio of height to width, e.g., of at least 5:1, with widths being from about 50 to about 500 microns In one exemplary embodiment the microchannels may have a width of about 100 microns, a height of 500 microns and wall thickness between channels of about 100 microns. In another exemplary embodiment the microchannels may have a width of about 400 microns, a height of 1 cm (100,000 microns) and wall thickness between channels of about 200 microns. In another exemplary embodiment the microchannels may have a nonlinear sinuous or serpentine path designed to increase flow disturbance over that of a straight channel in order to produce more efficient cooling.

The PCM component of the slurry may be microencapsulated, with the microencapsulated PCM particles desirably being of a diameter in the range of about 5 microns to about 50 microns, but in any case of a diameter significantly smaller than the width of the microchannel, for example, from about 5 to about 20 percent of the width of the microchannel. The slurry is desirably constructed to be easily pumped through the microchannels and may, by way of example, be a mixture of 30% PCM of high latent heat and 70% water or other fluid of high specific heat, or other percentages dependent upon design criteria. The choice of the PCM is mainly based on its melting point according the cooling application selected. The PCM would have a melting point ranging between about 20° C. and about 50° C. to maintain the surface to be cooled below about 100° C. If the slurry temperature were not allowed to rise more than 5° C. then the effective specific heat capacity will be 5 times that of water alone.

Accordingly, the present invention can overcome the disadvantages of an evaporative (liquid/vapor) microchannel system by removing the possibility of break down of fluid cooling at high temperatures such as might occur in an liquid-to-vapor phase change system due to a loss of capillary pumping or lack of wetting of the microchannels. Also, unlike the previously used liquid/boiling phase change, the solid/liquid phase change does not create low thermal conductivity vapor near the surface to be cooled.

BRIEF DESCRIPTION OF THE DRAWINGS

The aspects of this invention will be better understood from the following detailed description taken in conjunction with the drawings wherein.

DETAILED DESCRIPTION OF THE PREFERRED EMBODIMENTS

Figure 1:
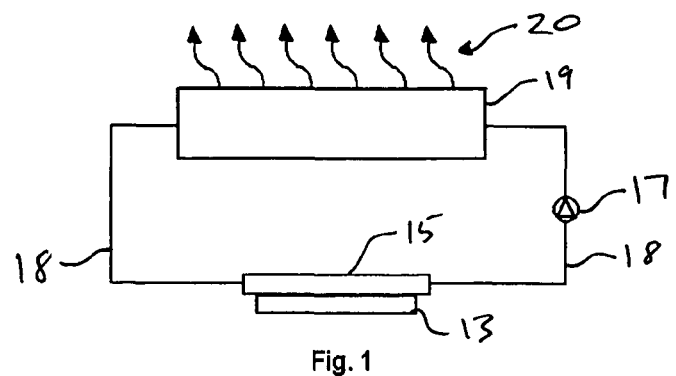
FIG. 1 schematically illustrates a cooling system for a heat generating component according to one embodiment of the present invention.
Figure 2:
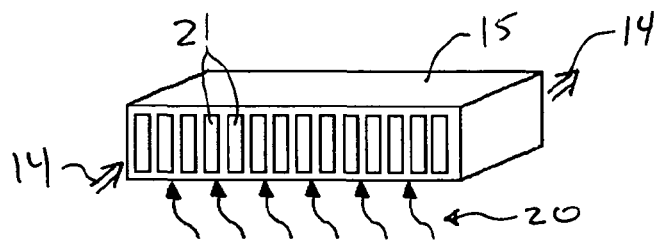
FIG. 2 illustrates the microchannel portion of the cooling system of FIG. 1 according to one embodiment of the present invention.

Referencing FIG. 1 and FIG. 2, a microchannel heat exchanger system 11 for a heat generating component 13 such as electronic components or circuitry including, but not limited to, one or more ICs, computer processors, batteries, fuel cells, printed circuit boards, or combinations thereof; comprises a primary microchannel heat exchanger 15 located in proximity to the heat generating component 13 to remove heat therefrom. The primary microchannel heat exchanger 15 can be separately manufactured apart from the heat generating component 13 to be locatable in proximity to the heat generating component 13 at a later time, or may be located originally or integrally, or both, with the heat generating component 13. A slurry 14, indicated by arrows in FIG. 2, comprising a liquid carrier with a particulate liquid/solid phase change material operable, as further described below, to melt in a heat range required for cooling the heat generating component 13. Desirably the primary microchannel heat exchanger 15 may be formed integrally with the IC such as on a "bottom" plane of the silicon substrate of the IC or the like. A pump 17 is provided for moving the liquid slurry 14 in channels 18 at a desired flow rate through the primary and secondary heat exchangers 15, 19. The microchannel heat exchanger system 11 desirably has a secondary heat exchanger 19 for transfer of heat 20 to ambient surroundings of the heat generating component 13 and the microchannel heat exchanger 15

Referencing especially FIG. 2, the primary microchannel heat exchanger 15 has a series of microchannels, collectively 21, for passage of the liquid/particulate slurry 14 which acts as a heat transfer medium to remove heat 20 from the heat generating component 13 (FIG. 1).

Achieving high heat flux for a heat transfer system without significantly increasing the temperature of the heat generating material requires low thermal resistance of the heat transfer system. In general, there are many possible methods for reducing a thermal resistance. However, the methods are constrained when the heat transfer system application is in a temperature critical environment, in a confined space, has possible limitations on weight and volume, power consumption, or combinations thereof.

The overall thermal resistance, θ, given by Equation 1, governs the maximum heat transfer rate of a heat exchanger when there is a constraint on the temperature difference between the heat transfer surface and the coolant fluid.

$$\theta = \Delta T_{max}/Q = \theta_{cond} + \theta_{conv} + \theta_{heat} \qquad \text{Eq. 1}$$

Where: θ=overall thermal resistance;
ΔTmax=driving temperature difference; and
Q=heat flux.

Three mechanisms contribute to the thermal resistance: θcond, i.e., conduction of heat through the walls of the heat exchanger; θconv, i.e., convection from the walls of the heat exchanger to the coolant fluid; and θheat, i.e., transient heating of the coolant fluid as it absorbs energy passing through the heat exchanger.

To achieve high heat transfer rates, each thermal resistance needs to be minimized. As known in the art, θcond is minimized by reducing the distance between the heat source and the heat transfer fluid and placing the heat exchanger in adequate proximity to, and desirably in intimate contact with, the heat source. Ideally, the latter solution can be implemented by making the heat exchanger and the heat source out of the same material, as in the case with microchannels formed on the bottom side of the silicon substrate of a microchip.

θconv can be significantly reduced in single-phase flows by decreasing the width of the heat exchanger channels which works due to a near inverse relationship between convective heat transfer coefficient and channel width, at low Reynolds number. The present invention supplies a lower Reynolds number than liquid-only coolants. θconv can also be significantly reduced in single-phase flows by increasing the area wetted by the heat transfer fluid such as by increasing the heat transfer surface area with microchannels. The present invention supplies a slurry whose liquid carrier remains in intimate contact with the microchannel walls at all times.

The role of PCM particles is very important for reducing θheat. The heating rate of fluids depends on the heat capacity and the flow rate of the fluid in the channel. As the PCM absorbs heat and undergoes phase change, the temperature of the fluid does not rise significantly due to latent heat storage. However, the effective specific heat of the material dramatically increases during the phase transition. For a MEPCM slurry the effective specific heat over the melting range of the PCM increases many times compared to the specific heat of the carrier fluid.

The MEPCM slurry thus may have a very high effective heat capacity over a small temperature range. The system can be designed so that the temperature between the inlet and outlet of the heat exchanger is very small and centered on the melting range of the MEPCM. This condition will keep the heat removal driving temperature difference between the slurry and the microchannel walls high as the fluid moves through the heat exchanger, without having to increase the flow rate as would be the case with sensible heating of a liquid/vapor coolant medium. Further thermal management improvements such as lower flow rate and lower temperatures can thus be obtained when using MEPCM particles in a coolant liquid slurry.

The manufacturing and use of microencapsulated PCM are established and MEPCM particles are now commercially available in sizes from 5 microns and greater. Preferably, the diameter size of the MEPCM particles used is in the range of about 5 microns to 50 microns, or desirably not more than about 5% to 20% of the channel width. For specific application to a heat transfer fluid of the present invention, an MEPCM desirably has a high wall strength, high latent heat and thermal conductivity, minimal supercooling of the PCM, and particles that will not aggregate.

The small size of MEPCM particles also leads to the conclusion that inertial effects will be dominated by the viscous effects. In other words, the Reynolds number based on the particle diameter will be very low. In low Reynolds number flow of suspensions, the particles follow the streamlines of the fluid. In laminar flow, this condition leads to little or no radial migration of the particles. Radial migration can be an important heat transfer mechanism for MEPCM slurries, but it can also lead to a layer with significantly decreased particle concentration near the heat transfer surface.

Figure 3:
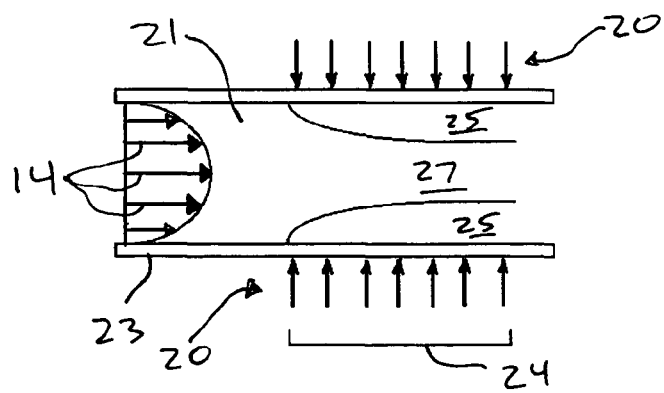
FIG. 3 is a schematic of MEPCM slurry melting action in laminar flow within a microchannel.

FIG. 3 shows the general process of transfer of heat 20 for the MEPCM slurry 14 in a microchannel 21 where the solid MEPCM particles in a laminar flow begin to melt near the walls 23 as the slurry 14 enters the highly heated section 24 of the primary heat exchanger microchannel 21. The flow develops into fully melted regions 25 near the walls 23 and a core 27 of unmelted, i.e., solid, particles. Melting occurs along a locus extending from the interior wall surface 29 towards the core 27 of the slurry flow.

When the flow is turbulent, the melting and solidification process reoccurs as the particles migrate from the core of the flow toward the walls. As the particles melt near the wall, the relative local temperature decreases, increasing the heat transfer coefficient. Further downstream along the channel, the fluid temperature increases, more and more of the particles remain in the liquid phase, and the heat transfer rate is reduced. Thus, mixing and turbulence play an important role in increasing the heat transfer coefficient. However, the flow 14 in straight or linear microchannels would normally be in the laminar regime.

Figure 4:
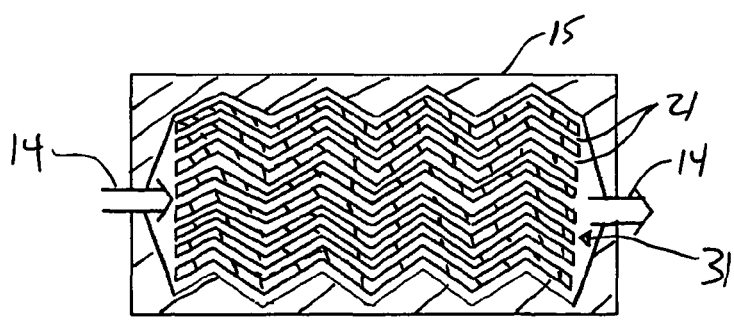
FIG. 4 illustrates a portion of a microchannel cooling system with non-linear, generally serpentine microchannels, according to one embodiment of the present invention.

Referencing FIG. 4, in one preferred embodiment of the invention the primary microchannel cooler 15 has microchannels 21 designed with disturbances to promote mixing and turbulence of the slurry 14. The exemplary microchannel pattern 31 is shown with sharp corners in a generally serpentine microchannel path which will lead to separation zones, and therefore enhanced mixing, downstream of the corners to achieve high heat transfer rates.

In Table 1, below, for an exemplary embodiment of the present invention using a 1 cm×1 cm example of a microchannel cooler for meeting a design criteria of the removal of 100 Watts (W) of heat over a square centimeter ($cm^2$) area using a MEPCM slurry of water and heptadecane, the assumed/given values and the calculated values indicate that various improvements in operational efficiency are available for a microchannel heat exchanger of the present invention over that of a liquid or liquid/vapor cooling system.

The mass flow rate of a two-component particle slurry for the removal of 100 Watts (W) of heat over a square centimeter ($cm^2$) area for one example of the present invention was estimated based on heat balance. The fluid was assumed to be a mixture of 30% heptadecane PCM and 70% water by mass and an assumption was made that all of the PCM melted in the heat exchanger over a temperature range of 5° C. A detailed description of the calculations, material properties, and assumptions are set forth below. With these assumptions, the mass flow rate of fluid needed to cool a surface while meeting the design criteria is 1.1 g/s/$cm^2$. In a 1 cm×1 cm microchannel heat exchanger with microchannel widths of 100 microns, height of 500 microns, and spacing between channels (channel gap) of 100 microns, the mean fluid velocity is 0.5 m/s, giving an approximate Reynolds number of 64, a safely laminar flow condition. The pressure drop over a 1 cm long channel is 6.9 kPa. The estimated pumping power is 8.4 mW. It will be appreciated that the invention is scalable and that the 1 cm×1 cm embodiment as set forth is for illustration and understanding of the invention.

According to a second example a two-component particle slurry for the removal of 200 Watts (W) of heat over a square centimeter ($cm^2$) area was assumed to be a mixture of 30% heptadecane PCM and 70% water by mass and an assumption was made that all of the PCM melted in the heat exchanger over a temperature range of 10° C. With these assumptions, the fluid velocity needed to cool a surface while meeting the design criteria is 0.64 m/s in a 2 cm length×1 cm width microchannel heat exchanger with 16 microchannels having widths of 400 microns, height of 1 cm, and spacing between channels (channel gap) of 200 microns, giving an approximate Reynolds number of 281. The pressure drop over the 2 cm long channel is 1.5 kPa. The estimated pumping power is 6.1 mW. It will again be appreciated that the invention is scalable and that the 2 cm×1 cm embodiment as set forth is for illustration and understanding of the invention.

Calculations:

Nomenclature q" Heat flux $\dot{m}$ Mass flow rate $C_{eff}$ effective specific heat $\Delta T$ temperature change of working fluid across heat exchanger The mass flow rate of the working fluid can be calculated from the energy into the working fluid:

$$q'' = \dot{m} C_{eff} \Delta T \qquad \text{Eq. 2}$$

$$\dot{m} = \frac{q''}{C_{eff} \Delta T} \qquad \text{Eq. 3}$$

The effective heat capacity of the fluid ($C_{eff}$) is due to the heat capacity of the water and the latent heat of fusion for the PCM. It's assumed that all of the PCM melts in the heat exchanger.

$$C_{eff} = \bar{c} + \frac{\phi\lambda}{\Delta T} \qquad \text{Eq. 4}$$

$$\bar{c} = c_w(1-\phi) + c_{pcm}\phi \qquad \text{Eq. 5}$$

The mass flow rate (m), from Eq. 3 and the channel geometry can be used to determine the average fluid velocity ($\mu_m$) in the microchannel.

$$\dot{m} = \bar{\rho} A_c \mu_m \qquad \text{Eq. 6}$$

$$\bar{\rho}^{-1} = \rho_w^{-1}(1-\phi) + \rho_{pcm\phi}^{-1} \qquad \text{Eq. 7}$$

The Reynolds number (Re) is calculated from the hydraulic diameter (D), the density of the slurry ($\rho$), the mean speed, and the viscosity of the slurry ($\mu$). The slurry was assumed to have a viscosity of 1.2 times the carrier fluid.

$$D = \frac{4A_c}{P} \qquad \text{Eq. 8}$$

$$Re = \frac{\bar{\rho} D u_m}{\bar{\mu}} \qquad \text{Eq. 9}$$

From the Reynolds number the pressure drop for laminar flow in a channel may be calculated from:

$$\Delta p = \frac{64}{Re}\frac{L}{D}\frac{\bar{\rho}u_m^2}{2} \qquad \text{Eq. 10}$$

The pumping power may be calculated from:

$$\text{Power} = 10^6 \times \frac{m\Delta P}{\eta\rho} \qquad \text{Eq. 11}$$

where $\eta$ is pump efficiency.

TABLE 1

The organic PCM selected was Heptadecane due to its superior physical properties.
The physical properties of Heptadecane are as follows:
Melting temperature = 27° C.
Latent heat of melting = 237 kJ/kg
Density = 775 kg/m³
Thermal conductivity: 0.15 W/m ° C.
Specific heat capacity = 2.05 kJ/kg ° C.
The results of the calculation are shown in the following Microchannel Calculations Given:
Suspension: Water and Heptadecane

| | | |
|---|---|---|
| Mass Fraction | F | 0.3 |
| Density | pw (kg/m3) | 998 |
| | ppcm (kg/m3) | 775 |
| Specific Heat | cw (kJ/kgK) | 4.18 |
| | cpcm (kJ/kgK) | 2.09 |
| Viscosity Water | mu (kg/ms) | 0.000993 |
| Viscosity Increase Factor (assumed) | | 1.2 |
| Latent Heat | lamPCM (kJ/kg) | 237 |
| Temp change of SUSDEdelT © | | 5 |
| Heat flux | q" (W/cm2) | 100 |
| running time | delt (s) | 300 |

TABLE 1-continued

Channel Dimensions

| | | |
|---|---|---|
| Oveall Width | W (cm) | 1 |
| Overall Length (cm) | | 1 |
| height channel | hc (microm) | 500 |
| width channel | wc | 100 |
| width gap | wg | 100 |

Calculated

| | | |
|---|---|---|
| specific heat of suspension | cbar (kJ/kgK) | 3.553 |
| effective specific heat (with phase change) | cs (kJ/kgK) | 17.773 |
| ratio of cs to cw | — | 4.25 |
| density of suspension | ps (kg/m3) | 919 |
| mass of suspension needed | m (kg) | 0.337591 |
| mass flow rate | mdot (kg/s) | 0.001125 |
| number of channels | n | 49 |
| mean velocity | um (m/s) | 0.50 |
| Hydralic Diameter | D (m) | 1.67E-04 |
| Reynolds number for Channel | ReD | 64 |
| Pressure Drop | delP (kPa) | 6.86 |
| Pumping Power | P (mW) | 8.41 |
| h (heat transfer coefficient) | kfNu/D | 10800 |
| f (volumetric flow rate) | cm3/s | 1.224891 |
| Surface Area/Projected Area | | 5.88 |

In comparison, the fluid velocity and the pressure drop for the same microchannel with water-only as the coolant fluid are 2.0 m/s and 22 kPa, respectively. The increase in pressure drop is due to the increased flow rate (4.8 g/s/cm²) needed to provide similar cooling rate, which leads to a required pumping power of 107 mW. The pumping power for the water-only coolant fluid case is thus much higher than the corresponding pumping power in the microchannel with MEPCM slurry.

Example 2

| | |
|---|---|
| Suspension: | water and microencapsulated Heptadecane |
| Mass fraction of PCM: | 30 wt % |
| Latent heat of PCM: | 237 kJ/kg |
| Microchannel heat exchanger dimensions: | |
| Length: | 2 cm |
| Width: | 1 cm |
| Channel height: | 1 cm |
| Channel width: | 400 micron |
| Channel wall thickness: | 200 micron |
| Number of channels: | 16 |
| Allowable temperature increase of the suspension: | 10° C. |
| Achievable heat flux: | 200 W/cm² |
| Effective specific heat capacity of the slurry based on 10° C. temperature rise: | 10.7 kJ/kg° C. |
| Ratio of the effective specific heat capacity of slurry to that of pure water: | 2.6 |

| Parameter | Water cooling in microchannel | water/PCM slurry cooling |
|---|---|---|
| Fluid velocity | 1.5 m/s | 0.64 m/s |
| Reynolds number | 717 | 281 |
| Pressure drop | 3.5 kPa | 1.5 kPa |
| Pumping power | 33.6 mW | 6.1 mW |

The above comparison shows that by replacing the water with PCM slurry, the pressure drop was reduced to more than half, reducing the pumping power requirement by about five times while achieving the same cooling rate.

Thus the present invention reduces θ total by use of a microchannel heat exchanger to reduce θcond, increases the convection heat transfer coefficient to reduce θconv; and increases the effective specific heat of the transfer fluid to reduce θheat; thereby providing an efficient and effective heat exchanger in a volume and power constrained environment.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

We claim:

1. A microchannel heat exchanger for a heat generating component, comprising:
    a slurry containing a microencapsulated particulate liquid/solid phase change material operable to melt in a heat range required for cooling the heat generating component;
    a heat exchanger located or locatable in proximity to the heat generating component to remove heat therefrom, the heat exchanger having a series of microchannels for passage of the liquid slurry, each of the microchannels having a non-linear path, a width of about 50 to about 500 microns, and an aspect ratio of height to width of at least 5:1;
    the slurry being within the microchannels of the heat exchanger and capsules of the microencapsulated phase change material being of a diameter in the range of about 5 percent to about 20 percent of the microchannel width; and
    a pump for moving the liquid slurry at flow rate through the heat exchanger;
    wherein the microchannel heat exchanger has a heat flux capacity of at least 100 W/cm$^2$.

2. The microchannel heat exchanger according to claim 1, further comprising:
    the slurry being a mixture of about 30% phase change material and about 70% water or other liquid of equal or higher specific heat, by mass.

3. The microchannel heat exchanger according to claim 1, further comprising:
    the melting point of the PCM being from about 20° C. to about 50° C.

4. The microchannel heat exchanger according to claim 1, further comprising:
    a secondary heat exchanger for transfer of heat to ambient surroundings of the heat generating component and the heat exchanger.

5. The microchannel heat exchanger according to claim 1, further comprising:
    the heat exchanger having an inlet and an outlet, with the temperature difference of the slurry between the inlet and the outlet being about 5° C. to about 20° C.

6. The microchannel heat exchanger according to claim 1 with a heat flux capacity of between about 100 W/cm$^2$ and 200 W/cm$^2$.

7. The microchannel heat exchanger according to claim 1, further comprising:
    the microchannels proportionately having a width of about 100 microns, a length of about 1 centimeter, and a height of 500 microns.

8. The microchannel heat exchanger according to claim 1, further comprising:
    the microchannels proportionately having a width of about 400 microns, a length of about 2 centimeters, and a height of 1 cm.

9. The microchannel heat exchanger according to claim 1, wherein the flow rate has a mean velocity of about 0.50 to about 0.64 meters/second.

10. The microchannel heat exchanger according to claim 1, further comprising:
    a wall thickness between channels of between about 100 to about 200 microns.

11. The microchannel heat exchanger according to claim 1, wherein the pressure drop is about 1.5 to about 6.86 kPa for a laminar flow within one microchannel.

12. The microchannel heat exchanger according to claim 1, wherein the pumping power requirement is about 6.1 to about 8.41 mW.

13. The microchannel heat exchanger according to claim 1, further comprising the heat exchanger being located in proximity to the heat generating component to remove heat therefrom.

14. The microchannel heat exchanger according to claim 13, further comprising the heat exchanger being integrally formed with the heat generating component to remove heat therefrom.

15. The microchannel heat exchanger according to claim 1 wherein the heat generating component is one of an integrated circuit, a computer processor, a battery, a fuel cell, or a printed circuit board.

16. The microchannel heat exchanger according to claim 1 wherein the heat exchanger comprises a series of serpentine microchannels having sharp corners within each of the series of serpentine microchannels.

17. The microchannel heat exchanger according to claim 1 wherein each of the microchannels comprises a plurality of separation zones, wherein each of the separation zones is separated from an adjacent separation zone by a sharp corner.

* * * * *